(12) United States Patent
Kim

(10) Patent No.: US 6,977,216 B2
(45) Date of Patent: Dec. 20, 2005

(54) METHOD FOR FORMING METAL WIRE IN SEMICONDUCTOR DEVICE

(75) Inventor: Hyung Jun Kim, Cheongu-Shi (KR)

(73) Assignee: Hynix Semiconductor Inc., Ichon-Shi (KR)

( * ) Notice: Subject to any disclaimer, the term of this patent is extended or adjusted under 35 U.S.C. 154(b) by 0 days.

(21) Appl. No.: 10/878,316

(22) Filed: Jun. 29, 2004

(65) Prior Publication Data

US 2005/0106853 A1    May 19, 2005

(30) Foreign Application Priority Data

Nov. 13, 2003  (KR) ...................... 10-2003-0080030

(51) Int. Cl.[7] .............................................. H01L 21/44
(52) U.S. Cl. ...................... 438/622; 438/618; 438/637; 438/700
(58) Field of Search ................................ 438/637–640, 438/634, 633, 700, 618, 688, 692, 411, 412, 438/622; 257/758, 759, 522, 773

(56) References Cited

U.S. PATENT DOCUMENTS 6,235,629 B1 * 5/2001 Takenaka .................... 438/638
6,252,290 B1 * 6/2001 Quek et al. ................. 257/522

* cited by examiner

Primary Examiner—Michael Lebentritt
Assistant Examiner—Yennhu B. Huynh
(74) Attorney, Agent, or Firm—Mayer, Brown, Rowe & Maw LLP

(57) ABSTRACT

The present invention relates to a method for forming a metal wire in a semiconductor device. The method comprises the steps of forming a lower metal wire on a semiconductor substrate, depositing an insulating film on the lower metal wire, forming a damascene etch pattern in the insulating film, depositing a conductive material on the insulating film so that the conductive material fills the damascene etch pattern, thus forming a conductive layer including step portions, depositing, on the conductive layer, a material having a high etch selective ratio against the conductive material, thus forming an anti-etch film, stripping a part of the anti-etch film by means of a CMP process until the conductive layer is exposed, striping a portion of the conductive layer by means of an etch process using the anti-etch film as an etch mask, and stripping the remaining anti-etch film and conductive layer by means of a CMP process, thus forming a conductive wire with which the damascene etch pattern is filled. Therefore, a large amount of slurry and the usage of a pad depending on a long-time polishing in a CMP process can be reduced. It is thus possible to save a process cost price in development and production of a semiconductor device.

8 Claims, 6 Drawing Sheets

METHOD FOR FORMING METAL WIRE IN SEMICONDUCTOR DEVICE

BACKGROUND

1. Field of the Invention

The present invention relates to a method for forming a metal wire that interconnects circuit components in a semiconductor device. More specifically, the present invention relates to a method for forming a metal wire in a semiconductor device which can provide a flat surface while a metal overfilled in a via or a trench by a damascene process is rapidly stripped by means of spin etching and chemical mechanical polishing (hereinafter, referred to as "CMP").

2. Discussion of Related Art

Generally, a semiconductor device is a device in which an integrated circuit is formed on a silicon wafer by means of a deposition process, a photolithography process, an etch process and so on. In order to interconnect components constituting the integrated circuit, a wire of a metal material such as copper having a relatively high conductivity, i.e., a metal wire is used. In order to form this metal wire, a single or dual damascene process is used.

The damascene process is a process in which a via and/or a trench formed by selectively etching an interlayer insulating film stacked on a lower metal wire is overfilled with a metal material. The surface of the metal wire formed by the damascene process is polished by means of the CMP process.

For example, in case where the via and/or the trench are/is filled with copper by means of the damascene process, if a deposition thickness of copper is below 1 $\mu$m, the CMP process is performed at a polishing rate of 6000~10000 Å/min using slurry for stripping copper, which is commercialized. However, in order to polish the copper film having a thickness of several $\mu$m or more such as an inductor by means of the CMP process using the slurry for stripping copper, a very long polishing time is needed. As a result, a large amount of consumables such as slurry and polishing pads are used.

Furthermore, if the copper wire is formed in a next-generation low-dielectric insulating film by means of a damascene process, there occurs a problem that a thin film is peeled off since the mechanical strength of the low-dielectric insulating film is weak. If the polishing pressure and rotary speed are lowered so as to prevent the peel-off phenomenon of the thin film, the amount of consumables used is increased.

Referring to FIG. 1A, if a copper film 19 is formed in an interlayer insulating film 13 formed on a lower metal wire 11 by means of a damascene process, a step occurs on the surface of the copper film 19 due to a difference in the width between a via and a trench. If a CMP process is performed as shown in FIG. 1B, the surface of the copper film 19 is not polished. Consequently, the uniformity of the copper wire 19a is degraded to lower reliability of the semiconductor device. Unexplained reference numeral 17 indicates a barrier film.

Meanwhile, in order to solve the above problem, there was proposed a hybrid process in which most of a metal is stripped by a chemical wet etch process such as spin etching and some of the metal is stripped by the CMP process. Since the spin etching is based on the wet process as shown in FIG. 2, the etching is equally performed regardless of the step of the copper film 29. Therefore, there occurs a problem that the polishing of a final copper wire 29a indicated by dotted lines is fundamentally impossible. In FIG. 2, reference numeral 21 indicates a lower wire, 23 designates an insulating film and 27 indicates a barrier film.

SUMMARY OF THE INVENTION

Accordingly, the present invention has been made in view of the above problems, and it is an object of the present invention to provide a method in which a second metal having an etch selective ratio higher than a first metal forming a conductive film is stacked on the conductive film, and a metal wire having a flat surface is then formed by means of a CMP process and a chemical wet etch process.

According to a preferred embodiment of the present invention, there is provided a method for forming a metal wire in a semiconductor device, comprising the steps of forming a lower metal wire on a semiconductor substrate, depositing an insulating film on the lower metal wire, forming a damascene etch pattern in the insulating film, depositing a conductive material on the insulating film so that the conductive material fills the damascene etch pattern, thus forming a conductive layer including step portions, depositing, on the conductive layer, a material having a high etch selective ratio against the conductive material, thus forming an anti-etch film, stripping a part of the anti-etch film by means of a CMP process until the conductive layer is exposed, striping a portion of the conductive layer by means of an etch process using the anti-etch film as an etch mask, and stripping the remaining anti-etch film and conductive layer by means of a CMP process, thus forming a conductive wire with which the damascene etch pattern is filled.

DETAILED DESCRIPTION OF PREFERRED EMBODIMENTS

The preferred embodiments of the present invention will be described with reference to FIG. 3 showing a process of forming a metal wire according to a preferred embodiment of the present invention and FIG. 4 showing a process of forming a metal wire according to another preferred embodiment of the present invention.

Figure 1A:
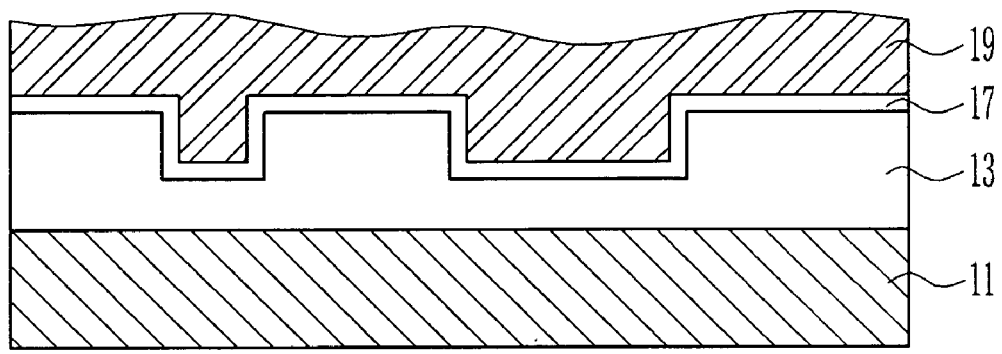
FIG. 1A and FIG. 1B are views for explaining a conventional process of forming a copper wire.
Figure 1B:
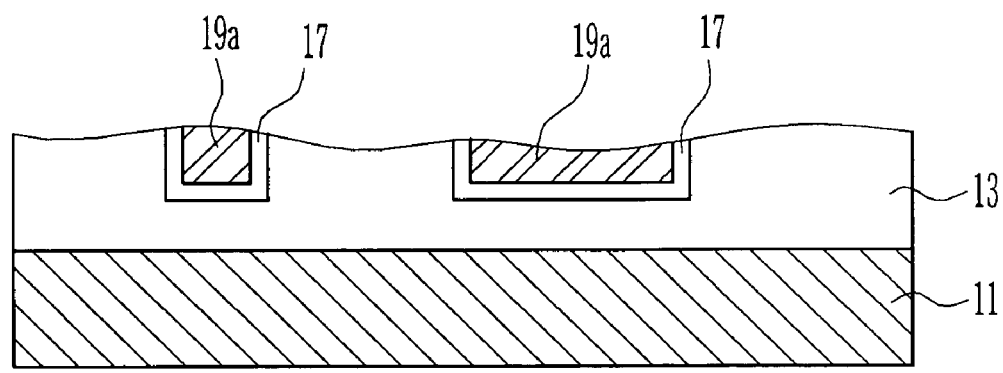
Figure 2:
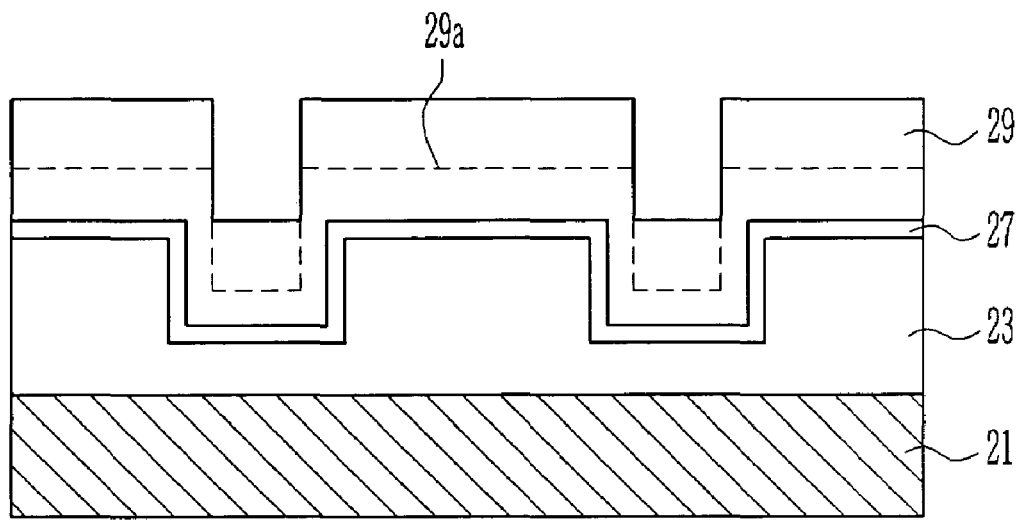
FIG. 2 shows a state where a copper film is etched by spin etching in the related art.
Figure 3A:
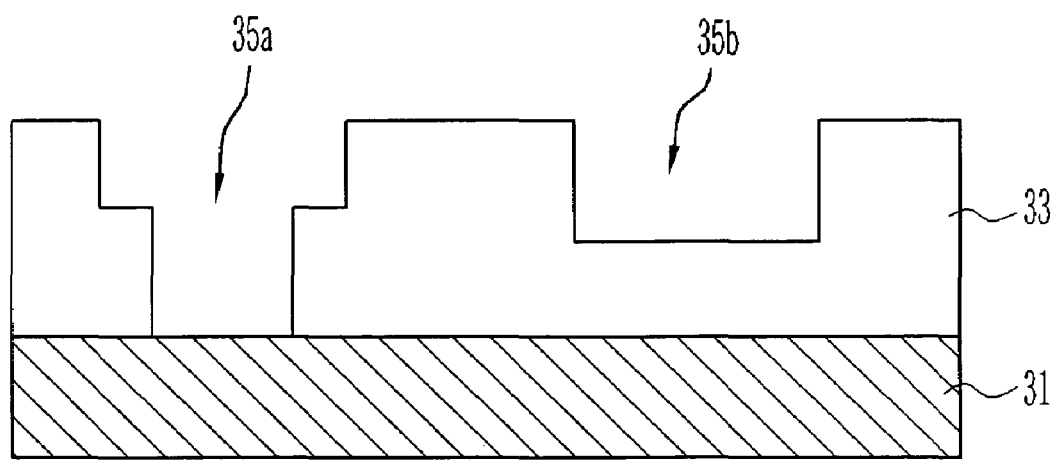
FIG. 3A to FIG. 3E are views for explaining a process of forming a metal wire according to a preferred embodiment of the present invention.
Figure 3B:
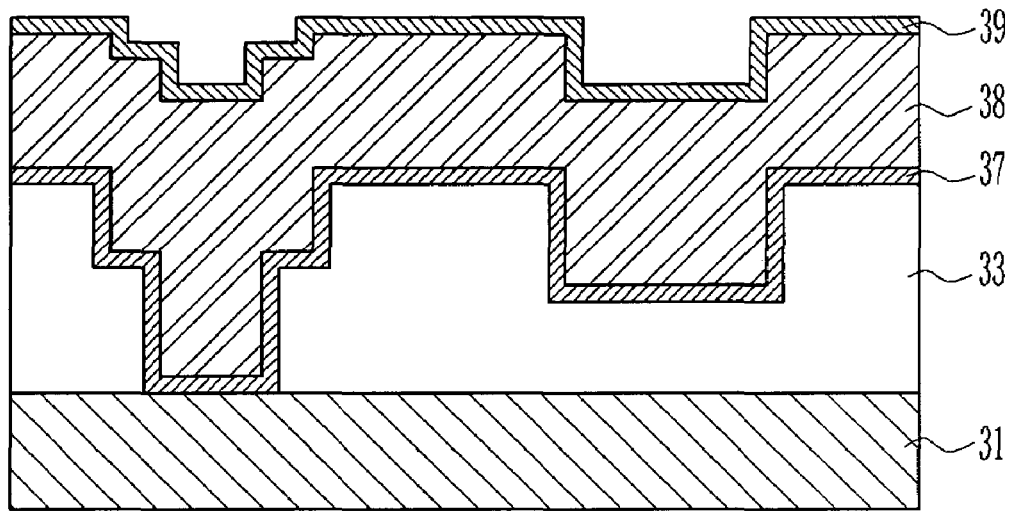
Figure 3C:
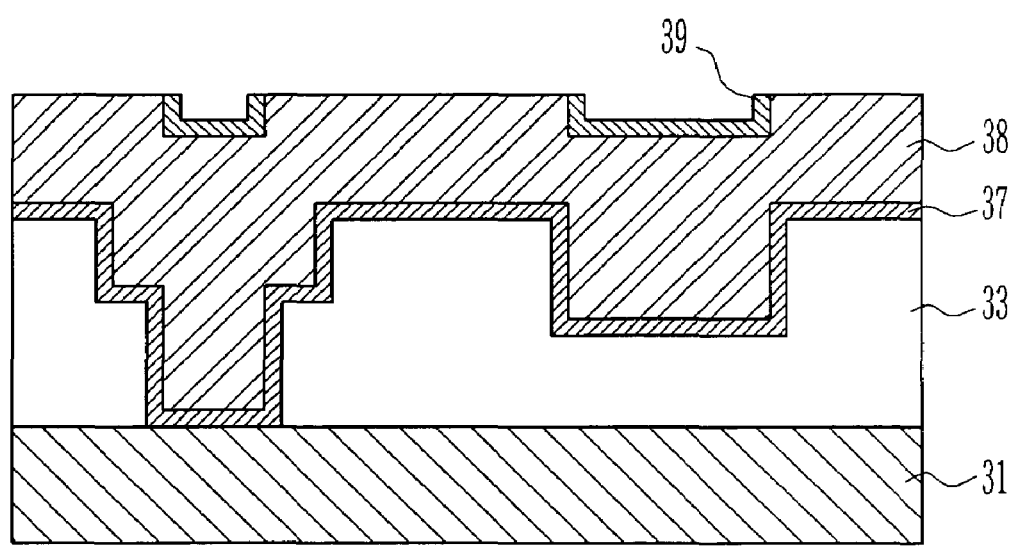
Figure 3D:
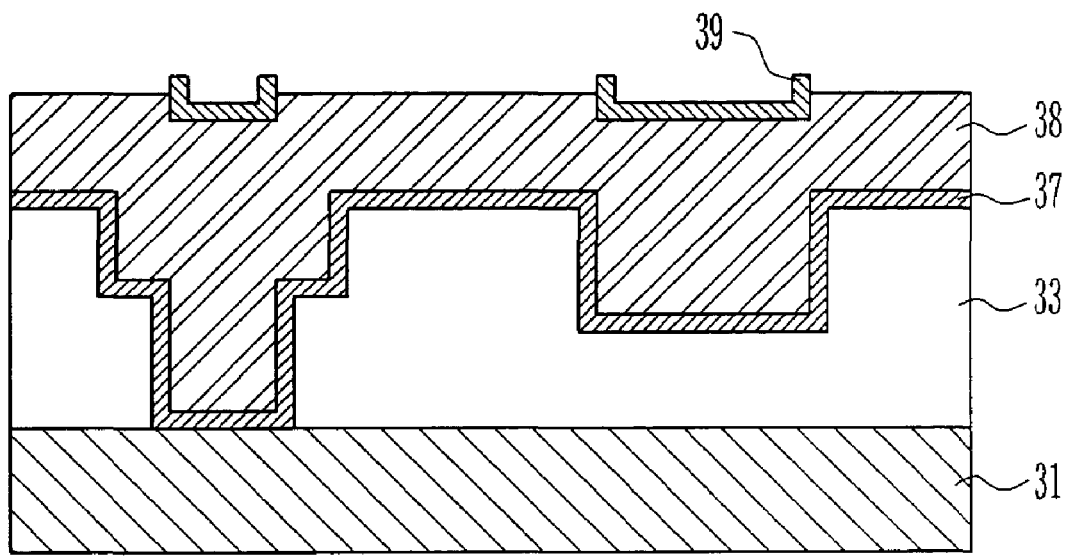
Figure 3E:
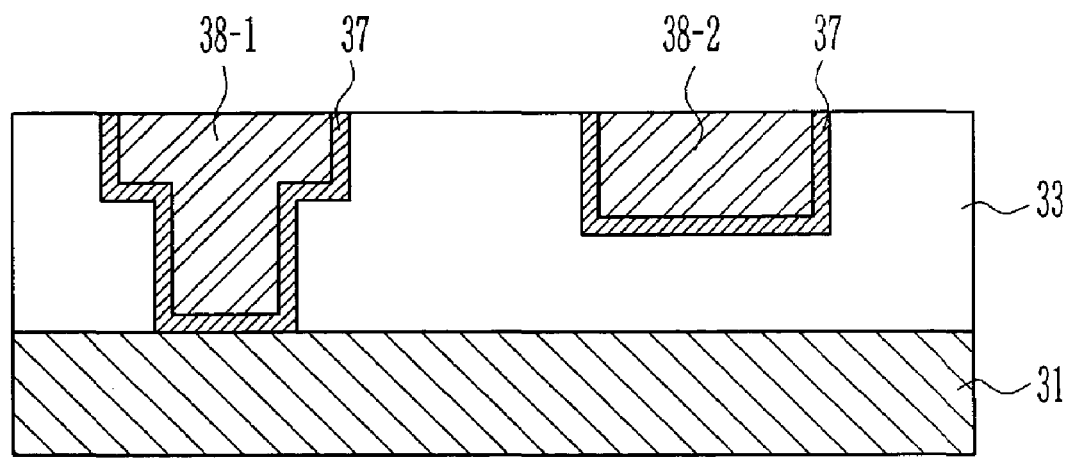

FIG. 3A shows a process of forming a damascene pattern, FIG. 3B shows a process of forming an anti-etch film, FIG. 3C shows a process of polishing a part of the anti-etch film, FIG. 3D shows a process of etching a part of the metal film, and FIG. 3E shows a process of forming a metal wire.

Referring first to FIG. 3A, a lower metal wire 31 of a predetermined thickness, which has a pattern of a given shape, is formed on a semiconductor substrate (not shown) by means of a deposition process, a photolithography process, an etch process and the like. An insulating film 33 and a photoresist are deposited on the lower metal wire 31. The photoresist is patterned to have a pattern (not shown) of a given shape by means of a photolithography process.

The insulating film 33 is then patterned by means of an etch process using the photoresist pattern as an etch mask. Damascene etch patterns connected to the lower metal wire, for example trenches 35a and 35b are formed in the insulating film 33 by means of the etch process.

Thereafter, as shown in FIG. 3B, Ta or TaN having a predetermined thickness is deposited on the whole surface of the insulating layer 33 having the trenches 35a and 35b formed therein by means of a chemical vapor deposition or physical vapor deposition process, so that a barrier film 37 for preventing diffusion is formed. A first metal, for example copper is plated on the whole surface of the barrier film 37 by means of a chemical vapor deposition or physical vapor deposition process, thus forming a copper film 38. The copper film 38 has a thickness enough to completely fill the trenches 35a and 35b. Ta is then deposited on the copper film 38 to form an anti-etch film 39 by means of a chemical vapor deposition or physical vapor deposition process.

According to a preferred embodiment of the present invention, the barrier film 37 and the anti-etch film 39 are not limited to Ta or TaN but can be formed using the first metal, for example a material having a wet etch rate lower than copper, i.e., a second metal having a high etch selective ratio against copper.

Referring to FIG. 3C, only portions stacked on the top of the copper film 38 except for a part of the anti-etch film 39, in particular portions that fill the step portions corresponding to right-above portions of the trenches 35a and 35b are stripped by means of a CMP process using slurry for stripping an anti-etch film, for example slurry for stripping tantalum.

As a result, a part of the anti-etch film 39 that fills the step portions remains without being stripped. In the above, it has been described that the step portions include only the portions corresponding to the right-above portions of the trenches 35a and 35b but may include step portions formed in the process of depositing the copper film 38.

By reference to FIG. 3D, the copper film 38 is etched up to the height similar to the bottom of the anti-etch film 39 remaining in the step portions by means of a chemical wet process, for example spin etching. At this time, tantalum components constituting the anti-etch film 39 has a high etch selective ratio against copper. Thus, tantalum components are not easily etched by means of the spin etching but remain after the CMP process. Resultantly, a part of the copper film 38 located at the bottom of the anti-etch film 39, i.e., a part of the copper film 38 that fill the trenches 35a and 35b is not etched by the spin etching.

Referring to FIG. 3E, a CMP process using slurry for stripping copper and slurry for stripping tantalum is performed to strip only some of the anti-etch film 39 and the copper film 38 remaining after the spin etching in FIG. 3D until the insulating film 33 is exposed, so that copper wires 38-1 and 38-2 filling the trenches 35a and 35b are formed.

Figure 4A:
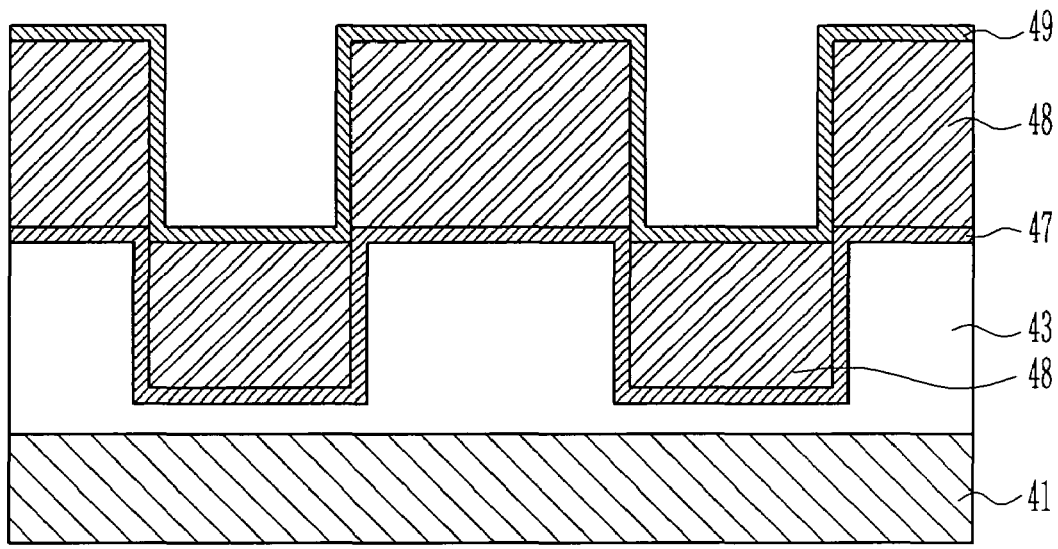
FIG. 4A to FIG. 4D are views for explaining a process of forming a metal wire according to another preferred embodiment of the present invention.
Figure 4B:
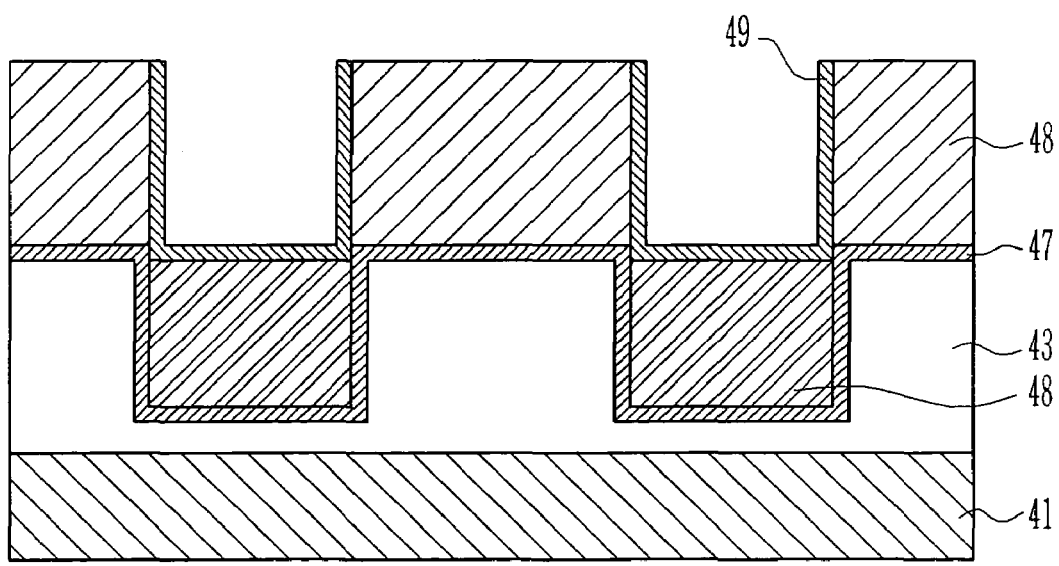
Figure 4C:
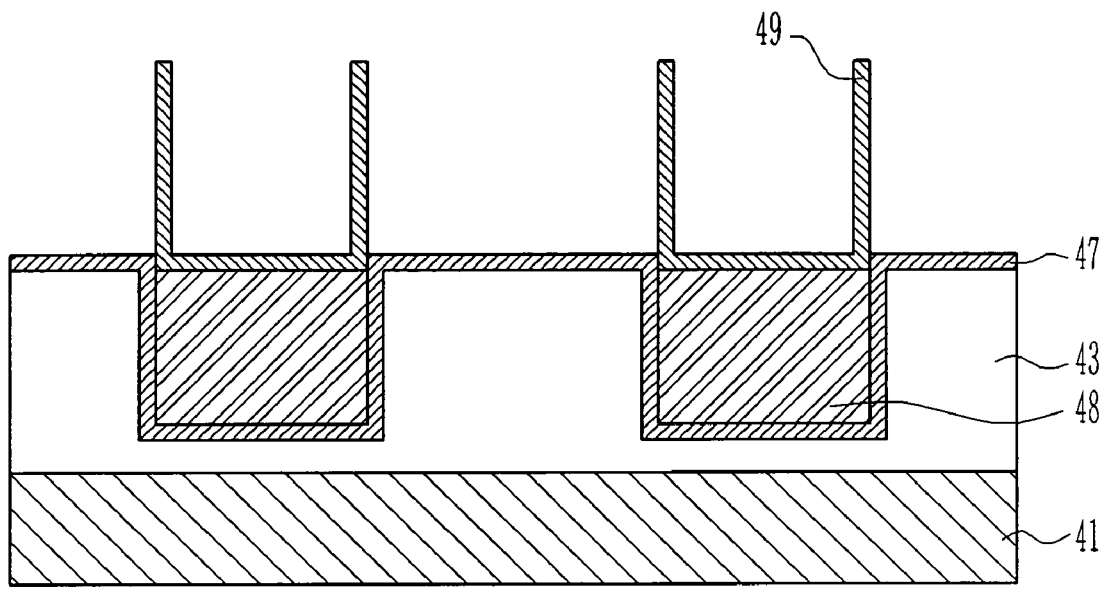
Figure 4D:
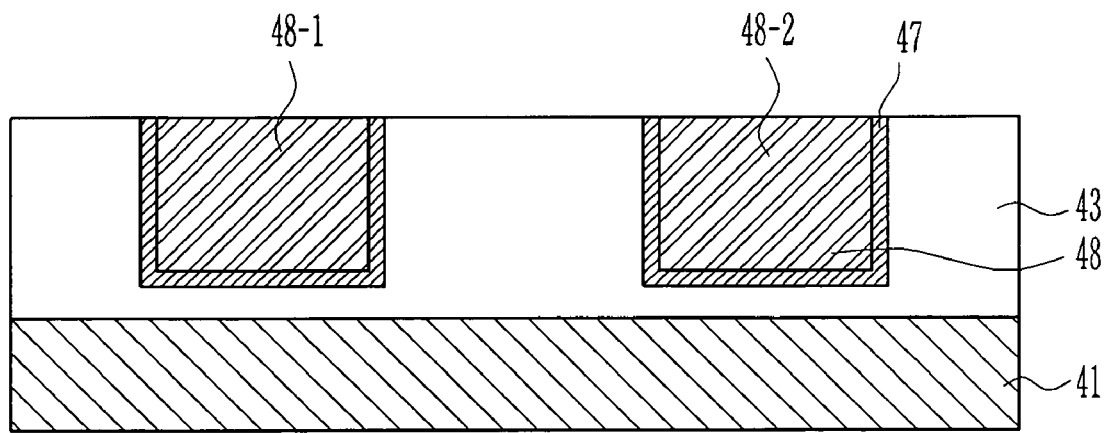

Furthermore, in FIG. 4 showing another preferred embodiment of the present invention, FIG. 4A shows a process of forming an anti-etch film, FIG. 4B is a process of polishing a part of the anti-etch film, FIG. 4C shows a process of etching some of a copper film, and FIG. 4D shows a process of forming a copper wire.

By reference to FIG. 4A, a lower metal wire 41 of a predetermined thickness, which has a pattern of a given shape, is formed on a silicon wafer (not shown) by means of a deposition process, a photolithography process and an etch process. After an insulating film 43 is deposited on the lower metal wire 41, a damascene etch pattern, i.e., a trench is formed by means of a photolithography process and an etch process.

Ta or TaN of a predetermined thickness is then deposited on the entire surface of the insulating layer 43 including the trench by means of a deposition process, thus forming a barrier film 47 serving as an anti-diffusion film. At least one first metal selected from a group consisting of copper, tungsten and aluminum is deposited on the entire surface of the barrier film 47 in a predetermined thickness to the extent that the trench is completely filled by means of a deposition process, thus forming a metal film 48. At this time, it is preferred that the deposition thickness of the metal film 48 has the same as a thickness of the insulating layer 43, in particular, the depth of the trench.

Thereafter, a material having a wet etch rate lower than the first metal is deposited on the metal film 48 to form an anti-etch film 49. In the above, the material constituting the anti-etch film 49 may include a metal having a high etch selective ratio against the first metal or an insulating material such as $SiO_2$ and SiN. For example, if the first metal is copper, the anti-etch film 49 may be formed using tantalum (Ta).

As shown in FIG. 4B, some of the anti-etch film 49 is stripped by means of a CMP process using slurry for stripping a material forming an anti-etch film until the metal film 48 is exposed. The anti-etch film 49 formed in the right-above portions of the trenches formed in the insulating film 43 remain without being stripped by the CMP process.

Referring to FIG. 4C, the metal film 48 stacked on the barrier film 47 is stripped by means of a chemical wet etch process, for example spin etching. Since the material constituting the anti-etch film 49 has a high etch selective ratio against the first metal constituting the metal film 48, it is not easily etched by the spin etching but remains intact. As a result, a part of the metal film 48 located at the bottom of the anti-etch film 49, i.e., a portion of the metal film 48 that fills the trench is not etched by the spin etching, but remains intact.

Referring to FIG. 4D, the anti-etch film 49 is stripped by means of spin etching using chemicals that can strip only the material constituting the anti-etch film. At this time, since some of the barrier film 47 is stripped by means of the spin etching until the top of the insulating film 43 is exposed, copper wires 48-1 and 48-2 filling the trenches are thus formed.

Meanwhile, according to still another embodiment of the present invention, the remaining anti-etch film 49 as shown in FIG. 4C can be stripped by means of a dry etch process, for example a plasma etch process. Then, the remaining barrier film 47 can be stripped by means of spin etching using chemicals having a high etch selective ratio against the first metal.

Furthermore, if the anti-etch film 49 is composed of an insulating material such a $SiO_2$ or SiN, the barrier film 47 and the anti-etch film 49 that remain when the metal film 49 on the barrier film 47 is stripped by the spin etching as described above are stripped by a CMP process.

At this time, in the CMP process, after the anti-etch film 49 is selectively etched, the barrier film 47 is stripped.

As described above, the process in which after the material having a high etch selective ratio against copper is stacked, the CMP process, the spin etching and the CMP process are sequentially performed, or the CMP process, the spin etching and the spin etching are sequentially performed to strip some of the metal film deposited on the insulating film, thereby forming the copper wire, can be applied to a case where a next-generation low-dielectric insulating film is used in the same manner. Moreover, in the above process, up to the anti-etch film can be stripped by controlling a deposition thickness of the first metal through a chemical etch process only without a subsequent CMP process.

According to the present invention as described above, since a copper wire is formed by means of a spin etching having a relatively low process cost, it is possible to reduce the amount of slurry and the usage of a pad due to a long-time polishing in a CMP process. Therefore, the present invention has an effect that it can save a process cost price in development and production of a semiconductor device that require a thick copper to be deposited and stripped.

Furthermore, in a copper wire using a next-generation low-dielectric insulating film, the cost price can be saved in a low polishing speed process that is used to prevent a peel-off phenomenon of a thin film in a CMP process. It is thus possible to supplement and replace the CMP process in relation to the peel-off of the thin film.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method for forming a metal wire in a semiconductor device, comprising the steps of:
    forming a lower metal wire on a semiconductor substrate;
    depositing an insulating film on the lower metal wire;
    forming a damascene etch pattern in the insulating film;
    depositing a conductive material on the insulating film so that the conductive material fills the damascene etch pattern, thus forming a conductive layer including step portions;
    depositing, on an entire top surface of the conductive layer, a material having a high etch selective ratio against the conductive material, thereby forming an anti-etch film;
    stripping a part of the anti-etch film by means of a chemical mechanical polishing (CMP) process until the conductive layer is exposed;
    stripping a portion of the conductive layer by means of an etch process using the anti-etch film as an etch mask; and
    stripping the remaining anti-etch film and conductive layer by means of a CMP process, thereby forming a conductive wire with which the damascene etch pattern is filled.

2. The method as claimed in claim 1, wherein the anti-etch film is tantalum.

3. The method as claimed in claim 2, wherein in the CMP process for stripping the anti-etch film, slurry for striping tantalum is used.

4. The method as claimed in claim 1, wherein the deposition thickness of the conductive layer is the same as the depth of the damascene etch pattern.

5. The method as claimed in claim 4, wherein the anti-etch film is composed of an insulating film such as a $SiO_2$ film or a SiN film.

6. The method as claimed in claim 5, wherein in the CMP process for stripping the anti-etch film, slurry for polishing an insulating film is used.

7. The method as claimed in claim 4, wherein before the conductive material is deposited on the insulating film, an anti-diffusion barrier film is formed, and the conductive film located at the top of the barrier film except for the conductive film located at the top of the anti-etch film is stripped by means of the etch process.

8. The method as claimed in claim 7, wherein the barrier film on the insulating film that is exposed by stripping the conductive film through the etch process is stripped by means of a spin etching using chemicals having a high etch selective ratio against the conductive material.

* * * * *